US00RE47505E

(19) United States
(12) Reissued Patent
Hsu et al.

(10) Patent Number: US RE47,505 E
(45) Date of Reissued Patent: Jul. 9, 2019

(54) THIN FILM TRANSISTOR STRUCTURE AND METHOD FOR MANUFACTURING THE SAME

(71) Applicant: E Ink Holdings Inc., Hsinchu (TW)

(72) Inventors: Cheng-Hang Hsu, Hsinchu (TW); Tzung-Wei Yu, Hsinchu (TW); Ted-Hong Shinn, Hsinchu (TW)

(73) Assignee: E Ink Holdings Inc., Hsinchu (TW)

(21) Appl. No.: 15/284,557

(22) Filed: Oct. 4, 2016

Related U.S. Patent Documents

Reissue of:
(64) Patent No.: 8,853,689
Issued: Oct. 7, 2014
Appl. No.: 13/740,283
Filed: Jan. 14, 2013

(30) Foreign Application Priority Data

Oct. 19, 2012 (TW) ..... 101138720

(51) Int. Cl.
*H01L 29/10* (2006.01)
*H01L 29/66* (2006.01)
*H01L 29/423* (2006.01)
*H01L 29/786* (2006.01)

(52) U.S. Cl.
CPC ..... *H01L 29/7869* (2013.01); *H01L 29/423* (2013.01); *H01L 29/66969* (2013.01); *H01L 29/786* (2013.01); *H01L 29/78696* (2013.01)

(58) Field of Classification Search
CPC ..... H01L 29/7869; H01L 29/423; H01L 29/66969; H01L 29/786; H01L 29/78696
See application file for complete search history.

(56) References Cited

U.S. PATENT DOCUMENTS

2005/0199959 A1* 9/2005 Chiang et al. ..... H01L 29/7869 257/368
2009/0283763 A1* 11/2009 Park et al. ..... H01L 29/78621 257/43
2011/0084264 A1 4/2011 Yamazaki et al. ..... H01L 29/7869 257/43
2011/0121289 A1 5/2011 Miyanaga et al. ..... H01L 29/7869 257/43
2013/0075721 A1* 3/2013 Yamazaki ..... H01L 27/12 257/43

* cited by examiner

*Primary Examiner* — Sean E Vincent
(74) *Attorney, Agent, or Firm* — JCIPRNET

(57) ABSTRACT

A thin film transistor (TFT) structure includes a metal oxide semiconductor layer, a gate, a source, a drain, a gate insulation layer, and a passivation layer. The metal oxide semiconductor layer has a crystalline surface which is constituted by a plurality of grains separated from one another. An indium content of the grains accounts for at least 50% of all metal elements *of the crystalline surface* of the metal oxide semiconductor layer. The gate is disposed on one side of the metal oxide semiconductor layer. The source and the drain are disposed on the other side of the metal oxide semiconductor layer. The gate insulation layer is disposed between the gate and the metal oxide semiconductor layer. The passivation layer is disposed on the gate insulation layer, and the crystalline surface of the metal oxide semiconductor layer is in direct contact with the gate insulation layer or the passivation layer.

5 Claims, 2 Drawing Sheets

THIN FILM TRANSISTOR STRUCTURE AND METHOD FOR MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application claims the priority benefit of Taiwan application serial no. 101138720, filed on Oct. 19, 2012. The entirety of the above-mentioned patent application is hereby incorporated by reference herein and made a part of this specification.

BACKGROUND OF THE INVENTION

1. Field of the Invention

The invention relates to a semiconductor structure and a method for manufacturing the same. More particularly, the invention relates to a thin film transistor (TFT) structure and a method for manufacturing the same.

2. Description of Related Art

The most common liquid crystal display (LCD) is mainly composed of a thin film transistor (TFT) array substrate, a color filter substrate, and a liquid crystal layer sandwiched between the two substrates. In a conventional TFT array substrate, amorphous silicon (α-Si) TFT or low temperature polysilicon TFT often serves as a switch device of each sub-pixel. Generally, the TFT at least has a gate, a source, a drain, a channel layer, and so on; and conductivity of the channel layer may be changed by controlling a voltage on the gate, such that the source and the drain are electrically conducted (ON) or electrically insulated (OFF). In addition, an n-doped or p-doped ohmic contact layer is often formed on the channel layer, so as to reduce the contact resistance between the channel layer and the source or between the channel layer and the drain. The channel layer of the conventional TFT is mostly made of α-Si or polysilicon.

The resultant TFT however requires high manufacturing temperature regardless of the material (α-Si or polysilicon) of the channel layer; therefore, the existing manufacturing process of low-temperature polysilicon and α-Si may cause damages to a flexible substrate, an adhesion layer, or other components. The damages to these components may further pose a negative impact on device characteristics of a display. In addition, both the carrier mobility and the reliability of the α-Si TFT are not sufficiently satisfactory, which considerably restricts the application range of the α-Si TFT.

SUMMARY OF THE INVENTION

The invention is directed to a thin film transistor (TFT) structure which contains grains with high indium content, thus improving the carrier mobility and the reliability of devices.

The invention is also directed to a method for manufacturing the aforesaid TFT structure.

In an embodiment of the invention, a TFT structure that is disposed on a substrate is provided. The TFT structure includes a metal oxide semiconductor layer, a gate, a source, a drain, a gate insulation layer, and a passivation layer. The metal oxide semiconductor layer has a crystalline surface that is constituted by a plurality of grains. The grains are separated from one another, and an indium content of the grains accounts for at least 50% of all metal elements *of the crystalline surface* of the metal oxide semiconductor layer. The gate is disposed on one side of the metal oxide semiconductor layer. The source and the drain are disposed on the other side of the metal oxide semiconductor layer. The gate insulation layer is disposed between the gate and the metal oxide semiconductor layer. The passivation layer is disposed on the gate insulation layer, and the crystalline surface of the metal oxide semiconductor layer is in direct contact with the gate insulation layer or the passivation layer.

In an embodiment of the invention, a method for manufacturing a TFT structure includes following steps. A gate is formed on a substrate. A gate insulation layer is formed on the substrate, and the gate insulation layer covers the gate and a portion of the substrate. A metal oxide semiconductor layer is formed on the gate insulation layer, and the metal oxide semiconductor layer exposes a portion of the gate insulation layer. A source and a drain are formed on the metal oxide semiconductor layer. Here, the source and the drain expose a portion of a surface of the metal oxide semiconductor layer. A passivation layer is formed on the source and the drain. Here, the passivation layer covers the source, the drain, and the gate insulation layer and is in direct contact with the portion of the surface of the metal oxide semiconductor layer exposed by the source and the drain, so as to form a crystalline surface. The crystalline surface is constituted by a plurality of grains separated from one another, and an indium content of the grains accounts for at least 50% of all metal elements *of the crystalline surface* of the metal oxide semiconductor layer.

In an embodiment of the invention, a method for manufacturing a TFT structure includes following steps. A source and a drain are formed on a substrate. Here, the source and the drain expose a portion of the substrate. A metal oxide semiconductor layer is formed on the substrate, and the metal oxide semiconductor layer covers the source, the drain, and the portion of the substrate exposed by the source and the drain. A gate insulation layer is formed on the substrate. Here, the gate insulation layer covers the metal oxide semiconductor layer, the source, and the drain, and the gate insulation layer is in direct contact with the metal oxide semiconductor layer, so as to form a crystalline surface. The crystalline surface is constituted by a plurality of grains separated from one another, and an indium content of the grains accounts for at least 50% of all metal elements *of the crystalline surface* of the metal oxide semiconductor layer. A gate is formed on the gate insulation layer. A passivation layer is formed on the gate and covers the gate and the gate insulation layer.

In light of the foregoing, the interface between the metal oxide semiconductor layer and the passivation layer/the gate insulation layer has the grains that are separated from one another, and the indium content of the grains account for at least 50% of all of the metal elements *of the crystalline surface* of the metal oxide semiconductor layer. Since indium is characterized by favorable conductivity, the TFT structure described herein may have high carrier mobility and great reliability.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
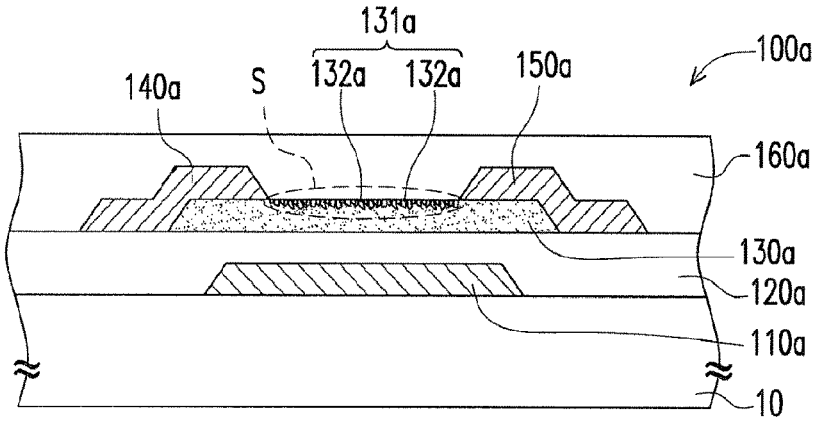
FIG. 1A is a schematic cross-sectional diagram illustrating a thin film transistor (TFT) structure according to an embodiment of the invention.
Figure 1B:
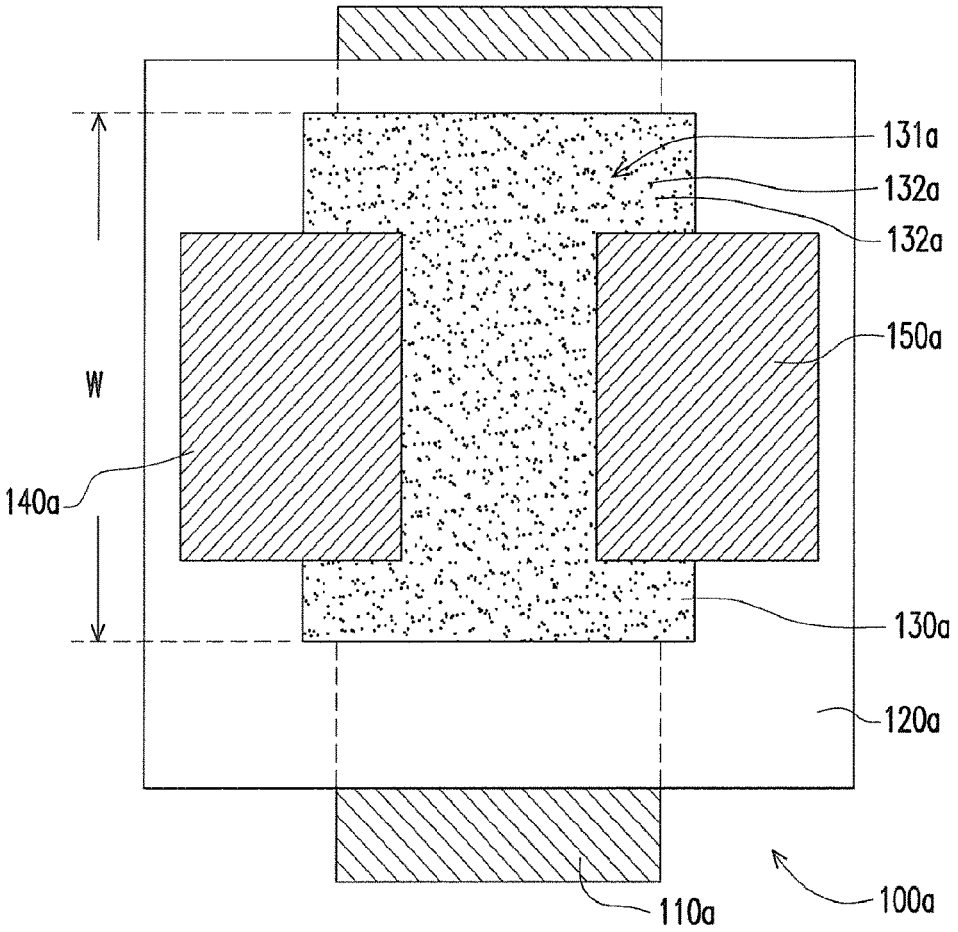
FIG. 1B is a schematic top diagram illustrating the TFT structure depicted in FIG. 1A.

FIG. 1A is a schematic cross-sectional diagram illustrating a thin film transistor (TFT) structure according to an embodiment of the invention. FIG. 1B is a schematic top diagram illustrating the TFT structure depicted in FIG. 1A. To better describe the invention, certain components shown in FIG. 1A are omitted in FIG. 1B. With reference to FIG. 1A, in a method for manufacturing a TFT structure, a gate 110a is formed on a substrate 10. A material of the substrate 10 is, for instance, glass, plastic, or any other suitable materials; a material of the gate 110a is metal, for instance.

With reference to FIG. 1A and FIG. 1B, a gate insulation layer 120a is formed on the substrate 10, and the gate insulation layer 120a covers the gate 110a and a portion of the substrate 10. Here, the gate insulation layer 120a is made of silicon oxide, silicon nitride or silicon oxynitride, for instance.

With reference to FIG. 1A and FIG. 1B, a metal oxide semiconductor layer 130a is formed on the gate insulation layer 120a, and the metal oxide semiconductor layer 130a exposes a portion of the gate insulation layer 120a. A material of the metal oxide semiconductor layer 130a is indium-gallium-zinc oxide (IGZO), for instance.

As shown in FIG. 1A and FIG. 1B, a source 140a and a drain 150a are formed on the metal oxide semiconductor layer 130a. Here, the source 140a and the drain 150a expose a portion of a surface S of the metal oxide semiconductor layer 130a. The source 140a and the drain 150a are made of metal, for instance, and the metal herein may be the same as or different from the metal employed for making the gate 110a. This should not be construed as a limitation to the invention.

As shown in FIG. 1A, a passivation layer 160a is formed on the source 140a and the drain 150a, and the passivation layer 160a covers the source 140a, the drain 150a, and the gate insulation layer 120a. Particularly, the passivation layer 160a is in direct contact with the portion of the surface S of the metal oxide semiconductor layer 130a exposed by the source 140a and the drain 150a, so as to form a crystalline surface 131a. Here, the crystalline surface 131a is constituted by a plurality of grains 132a separated from one another, and an indium content of the grains 132a accounts for at least 50% of all metal elements *of the crystalline surface* of the metal oxide semiconductor layer 130a. Preferably, the indium content of the grains 132a accounts for 53% of all of the metal elements *of the crystalline surface* of the metal oxide semiconductor layer 130a, a gallium content of the grains 132a accounts for 32% of all of the metal elements *of the crystalline surface* of the metal oxide semiconductor layer 130a, and a zinc content of the grains 132a accounts for 15% of all of the metal elements *of the crystalline surface* of the metal oxide semiconductor layer 130a. Said percentages of metal content refer to atomic percentages.

To be specific, the passivation layer 160a is formed at a temperature that exemplarily ranges from about 100° C. to about 300° C. in the present embodiment. In this manufacturing process, the grains 132a (i.e., the precipitates) containing rich indium content are gradually separated from the interface where the metal oxide semiconductor layer 130a is in contact with the passivation layer 160a, i.e., the portion of the surface S of the metal oxide semiconductor layer 130a. A material of the passivation layer 160a is, for instance, silicon oxide, silicon nitride, or silicon oxynitride, and a diameter of each of the grains 132a ranges from about 1 nm to about 100 nm, for instance. So far, the TFT structure 100a is substantially formed. In another embodiment of the invention, an annealing process may be performed after the passivation layer 160a is formed, and the temperature at which the annealing process is performed exemplarily ranges from about 200° C. to about 400° C. Thereby, the grains 132a with the rich indium content may be further separated from the portion of the surface S.

According to the present embodiment shown in FIG. 1A, the TFT structure 100a is disposed on the substrate 10 and includes the metal oxide semiconductor layer 130a, the gate 110a, the source 140a, the drain 150a, the gate insulation layer 120a, and the passivation layer 160a. The metal oxide semiconductor layer 130a has a crystalline surface 131a that is constituted by a plurality of grains 132a. The grains 132a are separated from one another, and an indium content of the grains 132a accounts for at least 50% of all metal elements *of the crystalline surface* of the metal oxide semiconductor layer 130a. The gate 110a is disposed on one side of the metal oxide semiconductor layer 130a. The source 140a and the drain 150a are disposed on the other side of the metal oxide semiconductor layer 130a. The gate insulation layer 120a is disposed between the gate 110a and the metal oxide semiconductor layer 130a. The passivation layer 160a is disposed on the gate insulation layer 120a, and the crystalline surface 131a of the metal oxide semiconductor layer 130a is in direct contact with the passivation layer 160a.

In details, according to the present embodiment, the gate 110a is disposed on the substrate 10, and the gate insulation layer 120a covers the gate 110a and a portion of the substrate 10. The metal oxide semiconductor layer 130a is disposed on the gate insulation layer 120a. The source 140a and the drain 150a expose the crystalline surface 131a of the metal oxide semiconductor layer 130a. The passivation layer 160a covers the source 140a, the drain 150a, the gate insulation layer 120a, and the crystalline surface 131a of the metal oxide semiconductor layer 130a. In brief, the TFT structure 100a described in the present embodiment is a bottom gate TFT structure. In addition, according to the present embodiment, a material of the metal oxide semiconductor layer 130a is IGZO, for instance; the gate insulation layer 120a and the passivation layer 160a are made of silicon oxide, silicon nitride or silicon oxynitride, for instance. A diameter of each of the grains 132a ranges from about 1 nm to about 100 nm, for instance.

The metal oxide semiconductor layer 130a described in the present embodiment has the interface (i.e., a portion of the surface S) that is in contact with the passivation layer 160a and is constituted by the grains 132a which are separated from one another, and the indium content of the grains 132a accounts for at least 50% of all metal elements *of the crystalline surface* of the metal oxide semiconductor layer 130a. Besides, conductivity of indium is rather favorable. Hence, the contact resistance between the source 140a and the metal oxide semiconductor layer 130a or between the drain 150a and the metal oxide semiconductor layer 130a may be reduced, such that the TFT structure 100a described herein may have high carrier mobility, high reliability, and high aperture ratio. Moreover, the interface where the metal oxide semiconductor layer 130a is in contact with the passivation layer 160a has the grains 132a. Accordingly, compared to the conventional oxide semiconductor layer that does not contain the grains, the metal oxide semiconductor layer 130a described in the present embodiment has a width W that may be reduced without affecting the aperture ratio, so as to save layout space and lower down manufacturing costs.

Figure 2:
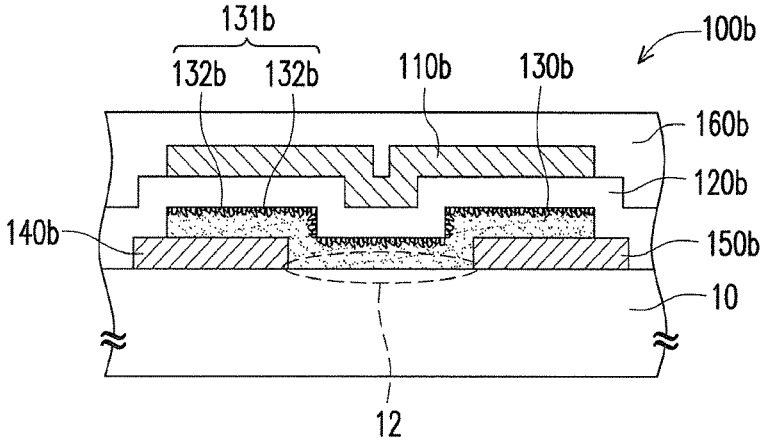
FIG. 2 is a schematic cross-sectional diagram illustrating a TFT structure according to another embodiment of the invention.

FIG. 2 is a schematic cross-sectional diagram illustrating a TFT structure according to another embodiment of the invention. With reference to FIG. 2, in a method for manufacturing a TFT structure, a source 140b and a drain 150b are formed on a substrate 10, and the source 140b and the drain 150b expose a portion 12 of the substrate 10. A material of the substrate 10 is, for instance, glass, plastic, or any other suitable materials; a material of the source 140a and a material of the drain 150b are metal, for instance.

As shown in FIG. 2, a metal oxide semiconductor layer 130b is formed on the substrate 10, and the metal oxide semiconductor layer 130b covers the source 140b, the drain 150b, and the portion 12 of the substrate 10 exposed by the source 140b and the drain 150b. A material of the metal oxide semiconductor layer 130b is IGZO, for instance.

As shown in FIG. 2, a gate insulation layer 120b is formed on the substrate 10, and the gate insulation layer 120b covers the metal oxide semiconductor layer 130b, the source 140b, and the drain 150b. In particular, the gate insulation layer 120b is in direct contact with the metal oxide semiconductor layer 130b, so as to form a crystalline surface 131b constituted by a plurality of grains 132b separated from one another, and an indium content of the grains 132b accounts for at least 50% of all metal elements *of the crystalline surface* of the metal oxide semiconductor layer 130b. Preferably, the indium content of the grains 132b accounts for 53% of all of the metal elements *of the crystalline surface* of the metal oxide semiconductor layer 130b, a gallium content of the grains 132b accounts for 32% of all of the metal elements *of the crystalline surface* of the metal oxide semiconductor layer 130b, and a zinc content of the grains 132b accounts for 15% of all of the metal elements *of the crystalline surface* of the metal oxide semiconductor layer 130b. Said percentages of metal content refer to atomic percentages.

To be specific, the gate insulation layer 120b is formed at a temperature that exemplarily ranges from about 100° C. to about 400° C. in the present embodiment. In this manufacturing process, the grains 132b (i.e., the precipitates) containing rich indium content are gradually separated from the interface where the metal oxide semiconductor layer 130b is in contact with the gate insulation layer 120b, i.e., the portion of the surface S of the metal oxide semiconductor layer 130b. A material of the gate insulation layer 120b is, for instance, silicon oxide, silicon nitride, or silicon oxynitride, and a diameter of each of the grains 132b ranges from about 1 nm to about 100 nm, for instance.

With reference to FIG. 2 again, a gate 110b is formed on the gate insulation layer 120b. A material of the gate 110b includes metal, for instance, and the metal herein may be the same as or different from the metal employed for making the source 140b and the drain 150b. This should not be construed as a limitation to the invention.

As shown in FIG. 2, a passivation layer 160b is formed on the gate 110b, and the passivation layer 160b covers the gate 110b and the gate insulation layer 120b. Here, the passivation layer 160b is made of silicon oxide, silicon nitride or silicon oxynitride, for instance. So far, the TFT structure 100b is substantially formed. In another embodiment of the invention, an annealing process may be performed after the passivation layer 160b is formed, and the temperature at which the annealing process is performed exemplarily ranges from about 200° C. to about 400° C. Thereby, the grains 132b with the rich indium content may be further separated from the portion of the surface S.

According to the present embodiment shown in FIG. 2, the TFT structure 100b is disposed on the substrate 10 and includes the metal oxide semiconductor layer 130b, the gate 110b, the source 140b, the drain 150b, the gate insulation layer 120b, and the passivation layer 160b. The metal oxide semiconductor layer 130b has a crystalline surface 131b that is constituted by a plurality of grains 132b. The grains 132b are separated from one another, and an indium content of the grains 132b accounts for at least 50% of all metal elements *of the crystalline surface* of the metal oxide semiconductor layer 130b. The gate 110b is disposed on one side of the metal oxide semiconductor layer 130b. The source 140b and the drain 150b are disposed on the other side of the metal oxide semiconductor layer 130b. The gate insulation layer 120b is disposed between the gate 110b and the metal oxide semiconductor layer 130b. The passivation layer 160b is disposed on the gate insulation layer 120b, and the crystalline surface 131b of the metal oxide semiconductor layer 130b is in direct contact with the gate insulation layer 120b.

To be specific, the source 140b and the drain 150b are disposed on the substrate 10 and expose a portion 12 of the substrate 10. The metal oxide semiconductor layer 130b is disposed on the source 140b and the drain 150b and covers the portion 12 of the substrate 10. The gate insulation layer 120b is disposed on the metal oxide semiconductor layer 130b and covers the metal oxide semiconductor layer 130b, the source 140b, and the drain 150b. The gate 110b is disposed on the gate insulation layer 120b, and the passivation layer 160b covers the gate 110b and the gate insulation layer 120b. In addition, according to the present embodiment, a material of the metal oxide semiconductor layer 130b is IGZO, for instance; the gate insulation layer 120b and the passivation layer 160b are made of silicon oxide, silicon nitride or silicon oxynitride, for instance. A diameter of each of the grains 132b ranges from about 1 nm to about 100 nm, for instance.

The metal oxide semiconductor layer 130b described in the present embodiment has the interface that is in contact with the gate insulation layer 120b and is constituted by the grains 132b which are separated from one another, and the indium content of the grains 132b accounts for at least 50% of all metal elements *of the crystalline surface* of the metal oxide semiconductor layer 130b. Besides, conductivity of indium is rather favorable. Hence, the contact resistance between the source 140b and the metal oxide semiconductor layer 130b or between the drain 150b and the metal oxide semiconductor layer 130b may be reduced, such that the TFT structure 100b described herein may have high carrier mobility, high reliability, and high aperture ratio. Moreover, the interface where the metal oxide semiconductor layer 130b is in contact with the gate insulation layer 120b has the grains 132b. Accordingly, compared to the conventional oxide semiconductor layer that does not contain the grains, the metal oxide semiconductor layer 130b described in the present embodiment has a width that may be reduced without affecting the aperture ratio, so as to save layout space and lower down manufacturing costs.

To sum up, the metal oxide semiconductor layer described herein has the interface that is in contact with the gate insulation layer or the passivation layer and is constituted by the grains which are separated from one another, and the indium content of the grains accounts for at least 50% of all metal elements *of the crystalline surface* of the metal oxide semiconductor layer. Besides, conductivity of indium is rather favorable. Therefore, the contact resistance between the source and the metal oxide semiconductor layer or between the drain and the metal oxide semiconductor layer may be reduced. As such, the TFT structure described herein may have high carrier mobility, high reliability, and high aperture ratio. Moreover, the interface where the metal oxide semiconductor layer is in contact with the passivation layer or the gate insulation layer has the grains. Accordingly, compared to the conventional oxide semiconductor layer that does not contain the grains, the metal oxide semiconductor layer described herein has the width that may be reduced without affecting the aperture ratio, so as to save layout space and lower down manufacturing costs.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A thin film transistor structure disposed on a substrate, the thin film transistor structure comprising:

a metal oxide semiconductor layer having a crystalline surface, wherein the crystalline surface is constituted by a plurality of grains separated from one another, and an indium content of the gains accounts for at least 50% of all metal elements *of the crystalline surface* of the metal oxide semiconductor layer;

a gate disposed on one side of the metal oxide semiconductor layer;

a source and a drain disposed on the other side of the metal oxide semiconductor layer;

a gate insulation layer disposed between the gate and the metal oxide semiconductor layer; and a passivation layer disposed on the gate insulation layer, wherein *the source and the drain expose the crystalline surface of the metal oxide semiconductor layer or* the crystalline surface of the metal oxide semiconductor layer is in direct contact with *and completely contacts* the gate insulation layer [or the passivation layer], and a material of the gate insulation layer and a material of the passivation layer comprise silicon oxide, silicon nitride, or silicon oxynitride.

2. The thin film transistor structure as recited in claim 1, wherein the gate is disposed on the substrate, the gate insulation layer covers the gate and a portion of the substrate, the metal oxide semiconductor layer is disposed on the gate insulation layer, the source and the drain expose the crystalline surface of the metal oxide semiconductor layer, and the passivation layer covers the source, the drain, the gate insulation layer, and the crystalline surface.

3. The thin film transistor structure as recited in claim 1, wherein the source and the drain are disposed on the substrate and expose a portion of the substrate, the metal oxide semiconductor layer is disposed on the source and the drain and covers the portion of the substrate, the gate insulation layer is disposed on the metal oxide semiconductor layer and covers the metal oxide semiconductor layer, the source, and the drain, the gate is disposed on the gate insulation layer, and the passivation layer covers the gate and the gate insulation layer.

4. The thin film transistor structure as recited in claim 1, wherein a material of the metal oxide semiconductor layer comprises indium-gallium-zinc oxide.

5. The thin film transistor structure as recited in claim 1, wherein a diameter of each of the grains ranges from about 1 nm to about 100 nm.

* * * * *